United States Patent
Muthers

(10) Patent No.: US 12,500,584 B2
(45) Date of Patent: Dec. 16, 2025

(54) SEMICONDUCTOR CHIP WITH AN INTEGRATED CIRCUIT

(71) Applicant: TDK-Micronas GmbH, Freiburg im Breisgau (DE)

(72) Inventor: David Muthers, Denzlingen (DE)

(73) Assignee: TDK-Micronas GmbH, Freiburg im Breisgau (DE)

( * ) Notice: Subject to any disclaimer, the term of this patent is extended or adjusted under 35 U.S.C. 154(b) by 48 days.

(21) Appl. No.: 18/423,973

(22) Filed: Jan. 26, 2024

(65) Prior Publication Data

US 2024/0259006 A1   Aug. 1, 2024

(30) Foreign Application Priority Data

Jan. 26, 2023  (DE) .................... 10 2023 101 916 U

(51) Int. Cl.
*H02M 3/07*    (2006.01)
*H03K 5/24*    (2006.01)

(52) U.S. Cl.
CPC .............. *H03K 5/249* (2013.01); *H02M 3/07* (2013.01)

(58) Field of Classification Search
CPC ..... H03K 5/249; H03K 19/0944; H02M 3/07; H02M 3/073
See application file for complete search history.

(56) References Cited

U.S. PATENT DOCUMENTS

| | | | |
|---|---|---|---|
| 5,376,832 A | 12/1994 | Gariboldi et al. | |
| 2008/0048618 A1* | 2/2008 | Melanson | H02J 7/00308 320/134 |
| 2011/0163797 A1* | 7/2011 | Posat | H03K 17/302 327/537 |
| 2014/0043715 A1 | 2/2014 | Cosgrave et al. | |

FOREIGN PATENT DOCUMENTS

DE           69222144 T2     2/1998

* cited by examiner

*Primary Examiner* — Sibin Chen
(74) *Attorney, Agent, or Firm* — The Webb Law Firm

(57) ABSTRACT

A semiconductor chip with an integrated circuit has supply voltage connectors and an output stage with an output for releasing an output signal. The output is connected via a drain-source line of a first self-closing insulated-gate field-effect transistor to an output connection for the output signal. The semiconductor chip has a clock signal generator fed from the supply voltage connections, its clock signal output is connected galvanically decoupled to an input voltage connection of a charge pump. A first output voltage connection of the charge pump is connected to the gate, and a second output voltage connection is connected to the bulk of the insulated-gate field-effect transistor. The output voltage connections are also connected to one another by means of a discharge path.

7 Claims, 6 Drawing Sheets

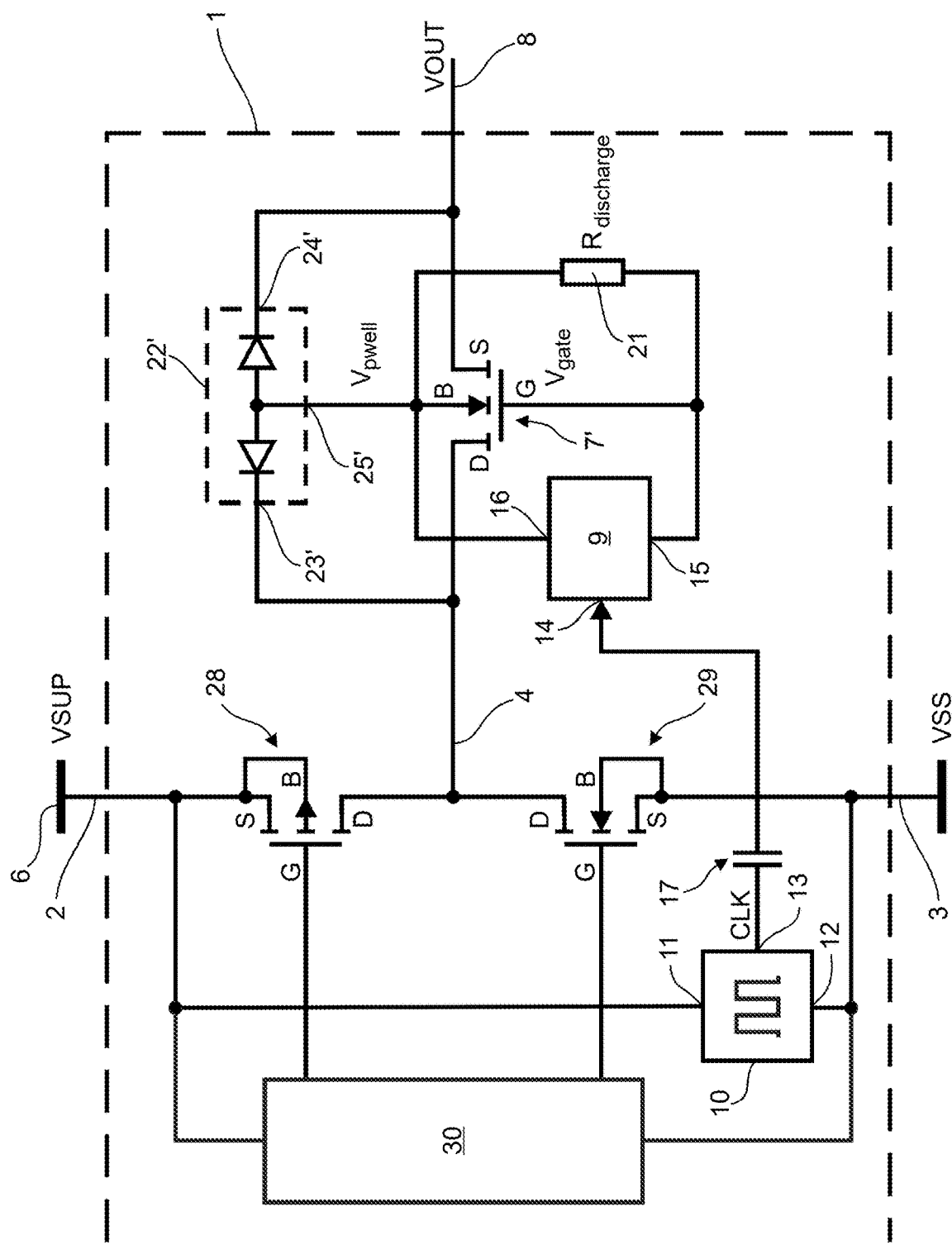

SEMICONDUCTOR CHIP WITH AN INTEGRATED CIRCUIT

CROSS-REFERENCE TO RELATED APPLICATION

This application claims priority to German Patent Application No. 10 2023 101 916.3 filed Jan. 26, 2023, the disclosure of which is hereby incorporated by reference in its entirety.

BACKGROUND OF THE INVENTION

Field of the Invention

The invention relates to a semiconductor chip with an integrated circuit that has a first and a second supply voltage connection as well as an output stage with at least one output for releasing an output signal.

Description of Related Art

These types of semiconductor chips are known in a variety of ways in practice, and with specific applications, the output of the output stage has to be high resistance if due to a fault an output voltage is not applied to at least one supply voltage connection. This type of fault can occur, in particular, with a line break, where a supply line to the integrated circuit is interrupted, so that there is no supply voltage applied between the supply voltage connectors of the integrated circuit. In such a case, an electric voltage in the regular voltage range can be applied to an analog output of an integrated circuit using pull-up or pull-down, for example.

If the output of an integrated circuit is connected to the input of a safety-relevant switch, for example an engine control unit of a motor vehicle, it is possible that the test equipment contained in the safety-relevant circuit will interpret the faulty analog output signal of the integrated circuit as a valid analog signal if the faulty input signal is in the regular voltage range.

FIGS. 8 through 11 show four possible combinations of line breaks and pull up or pull down resistors. FIGS. 8 and 9 show harmless cases, where resistor RL pulls output Vout to release an analog output signal of integrated circuit IC to potential VSUP or VSS, which is applied to the still intact supply line, which is connected to the supply connector of the integrated circuit to which it is assigned and connected to output Vout via the load resistor.

With the line break in FIG. 10, output Vout of integrated circuit IC is pulled from resistor RL to a potential that is over potential VSS of the still intact supply line and lower than potential VSUP. With the line break per FIG. 11, output Vout of integrated circuit IC is pulled from resistor RL to a potential that is under potential VSUP of the still intact supply line and higher than potential VSS.

With the cases shown in FIGS. 10 and 11, a leakage current Ileak can occur at output Vout that causes a voltage drop on resistor RL and therefore generates voltages at output Vout that can be interpreted as valid signals by a safety-relevant circuit ECU connected to output Vout.

A case such as this has to be avoided so that when a line break occurs in a supply line of the integrated circuit, the leakage current remains below a predetermined threshold value so that the safety-relevant circuit can recognize the analog output signal of the integrated circuit as faulty and, if necessary, can switch to an emergency operating state where, instead of the analog output signal, a substitute signal can be used that, despite the line break, enables safe operation of equipment connected to the circuit, such as a drive motor, for example.

For an integrated circuit of the type above as well, where a bus for a data processing device is attached to the output, in the case of a line break in a supply line for the integrated circuit, the leakage current at the output of the integrated circuit should remain below a predetermined threshold value, so that the bus is not loaded due to the failed integrated circuit.

SUMMARY OF THE INVENTION

The task is to create a semiconductor chip of the type above, in which the output of the integrated circuit is of high resistance when a supply potential applied to the supply voltage connection of a circuit integrated in a semiconductor fails, even when there is an external electrical voltage at the output of the integrated circuit.

This task is accomplished with the characteristics as described herein. According to the invention, it is intended that the output of the output stage be connected to the output connection for the output signal via a drain-source line of a first self-closing insulated-gate field-effect transistor, that the semiconductor chip has a clock signal generator fed by the supply voltage connections, and a charge pump with an input voltage connection and output voltage connections to release an output voltage, that a clock signal output for creating a clocked input voltage is connected by means of capacitive and/or inductive coupling with the input voltage connection of the charge pump, that to create a gate voltage on the first insulated-gate field-effect transistor, a first output voltage connection of the charge pump is connected to the gate and a second output voltage connection of the charge pump is connected to the bulk of the first insulated-gate field-effect transistor, that parallel to this a discharge path is connected to balance a voltage applied to the output voltage connections of the charge pump when there is a missing clock signal.

In an advantageous manner, it is thereby possible to safely shut down the drain-source line of the self-closing insulated-gate field-effect transistor when there is a missing supply voltage and to bring it into a high resistance state. When the voltage supply is missing there is no supply voltage on the electrical supply voltage connections of the clock signal generator, so that the clock signal generator can no longer generate the clocked input voltage for the charge pump. Accordingly, the charge pump does not generate a gate voltage for the self-closing insulated-gate field-effect transistor, whereby its source-drain line closes and the output connection for the output signal becomes high resistance. The gate has no connection to the non-insulated p-n junctions and can therefore be easily pulled to bulk or well potential. Preferably at least one resistor element is arranged in the discharge path.

The task of the charge pump is to convert the clock signal of the clock signal generator into a DC voltage that can only switch on the first self-closing insulated-gate field-effect transistor when the clock signal is applied to the input voltage connection of the charge pump. By using a clock signal instead of a d.c.*voltage signal as the control signal to control the gate-source line of the first self-closing insulated-gate field-effect transistor, it is possible to transmit the control signal galvanically decoupled between a low-voltage part of the integrated circuit and the output connection of the semiconductor chip in order to generate a DC voltage to activate the gate. The output connection can have a significantly higher level than the internal low voltage of the semiconductor chip or even a negative level.

In a further embodiment of the invention, the semiconductor chip has an extreme value selector that is connected with a first selector input to the drain connection of the first insulated-gate field-effect transistor, with a second selector input to the source connection of the first insulated-gate field-effect transistor, and with an extreme value output to the bulk of the first insulated-gate field-effect transistor, whereby the first insulated-gate field-effect transistor is of N-channel type, and the extreme value selector is designed as a minimum selector that, when the electrical potentials on the selector input differ, connects the selector input with the lowest potential to the selector output. In another preferred embodiment of the invention, it is intended that the semiconductor chip have an extreme value selector that is connected with a first selector input to the drain connection of the first insulated-gate field-effect transistor, with a second selector input to the source connection of the first insulated-gate field-effect transistor, and with an extreme value output to the bulk of the first insulated-gate field-effect transistor, and that the first insulated-gate field-effect transistor is of P-channel type, and the extreme value selector is designed as a maximum selector that, when the electrical potentials on the selector input differ, connects the selector input with the highest potential to the selector output. Both when applying an external voltage to the output connection and when applying a voltage to the output of the output stage (the latter can occur, for example, during a line break in a supply line for the semiconductor chip), through the extreme value selector the bulk of the first insulated-gate field-effect transistor is always maintained at the potential at which the first insulated-gate field-effect transistor can be safely closed should the clock signal drop out.

In a preferred embodiment of the invention, the clock signal output of the clock signal generator is connected to the input voltage connection of the charge pump by means of a capacitive coupling. The capacitive coupling can have a capacitor element integrated in the semiconductor chip.

In another practical embodiment of the invention, the clock signal output of the clock signal generator is connected to the input voltage connection of the charge pump by means of an inductive coupling. The capacitive coupling can have a transducer integrated in the semiconductor chip.

In a practical embodiment of the invention, the charge pump has a capacitor connected parallel to its output connections as well as a first and a second diode, whereby the anode of the first diode is connected to the input connection of the charge pump and the cathode of the first diode is connected to a first electrode of the capacitor, and whereby the anode of the second diode is connected to a second electrode of the capacitor and the cathode of the second diode is connected to the input connection of the charge pump. This enables a a simple design of the charge pump.

It is advantageous if the maximum selector has a second self-closing insulated-gate field-effect transistor of P-channel type and a third self-closing insulated-gate field-effect transistor of P-channel type, if the first selector input is connected to the drain connection of the second insulated-gate field-effect transistor and the gate of the third insulated-gate field-effect transistor, if the second selector input is connected to the source connection of the third insulated-gate field-effect transistor and the gate of the second insulated-gate field-effect transistor, and if the extreme value output of the maximum selector is connected to the source connection and bulk connection of the second insulated-gate field-effect transistor as well as the drain connection and bulk connection of the third insulated-gate field-effect transistor. In the same manner, the minimum selector can have a second self-closing insulated-gate field-effect transistor of N-channel type and a third self-closing insulated-gate field-effect transistor of N-channel type, whereby the first selector input is connected to the drain connection of the second insulated-gate field-effect transistor and the gate of the third insulated-gate field-effect transistor, whereby the second selector input is connected to the source connection of the third insulated-gate field-effect transistor and the gate of the second insulated-gate field-effect transistor, and whereby the extreme value output of the minimum selector is connected to the source connection and bulk connection of the second insulated-gate field-effect transistor as well as the drain connection and bulk connection of the third insulated-gate field-effect transistor. The maximum selector and minimum selector can also have insulated-gate field-effect transistors, which simplifies their integration in the semiconductor chip.

In a preferred embodiment of the invention, the output stage is a complementary CMOS output stage, in which a first insulated-gate field-effect transistor element is arranged with a complementary second insulated-gate field-effect transistor element, whereby the drain of the first insulated-gate field-effect transistor element is connected to the first voltage supply connection and the source of the second insulated-gate field-effect transistor element is connected to the second supply voltage connection, and whereby the output of the output stage is provided on a half-bridge section connecting the source of the first insulated-gate field-effect transistor element with the drain of the second insulated-gate field-effect transistor element.

BRIEF DESCRIPTION OF THE DRAWINGS

In the following, exemplary embodiments of the invention will be explained in greater detail, using the drawing. It shows FIG. 1 a partial view of a block schematic of a semiconductor chip into which an electric circuit is integrated, having an output stage with an output for releasing an analog output signal, which is connected to an output connection of a semiconductor chip via a P-channel insulated-gate field-effect transistor FIG. 2 a graphical representation of a clock signal applied at the input of a charge pump, where time t is entered on the X axis and the voltage Vclk on the Y axis FIG. 3 a schematic of a block pump FIG. 4 a graphical representation of gate voltage of the N-channel insulated-gate field-effect transistor, whereby time t is entered on the X axis and the gate voltage Vgate on the Y axis FIG. 5 a schematic of a maximum selector FIG. 6 a partial view of a block schematic of a semiconductor chip into which an electric circuit is integrated, having an output stage with an output for releasing an analog output signal, which is connected to an output connection of a semiconductor chip via a N-channel insulated-gate field-effect transistor FIG. 7 a schematic of a minimum selector, and FIG. 8 through 11 prior art known electric circuits that have an integrated circuit (IC) with an output Vout to release an analog output signal and a safety-relevant circuit ECU connected to the output, whereby the integrated circuit is connected to two voltage supply lines, of which one is interrupted.

DESCRIPTION OF THE INVENTION

Figure 1:
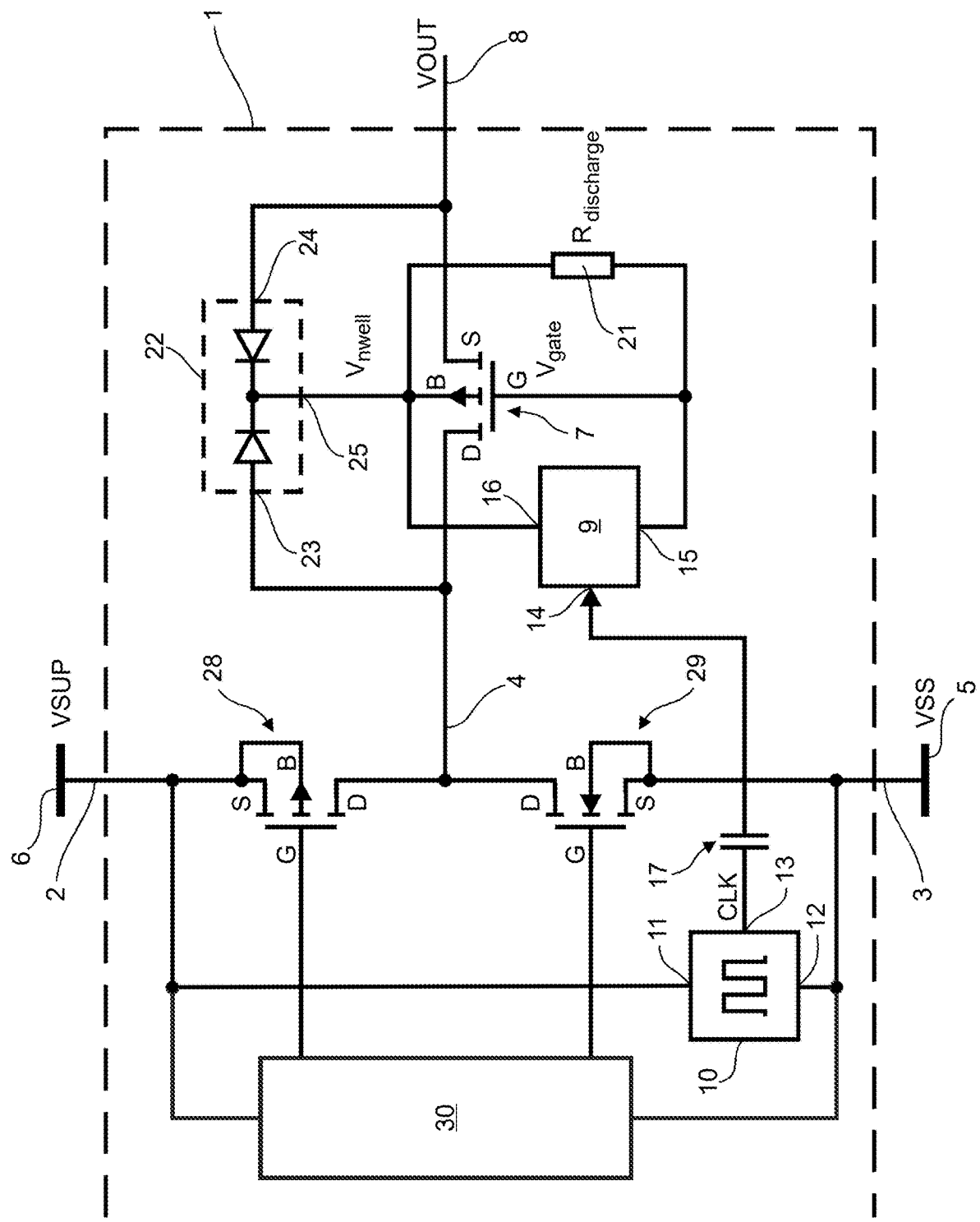

A semiconductor chip has an integrated circuit 1 only partially displayed in FIG. 1, that has a first supply voltage connection 2, a second supply voltage connection 3, and an output stage with at least one output 4 for releasing an analog output signal. To generate a supply voltage, the supply voltage connections 2, 3 are connected via electrical supply lines with 5, 6 of an external voltage source not further displayed in the drawing.

The output 4 of the output stage is connected via a drain-source line of a first self-closing P-channel insulated-gate field-effect transistor 7 to an output connection 8 of the semiconductor chip.

Figure 2:
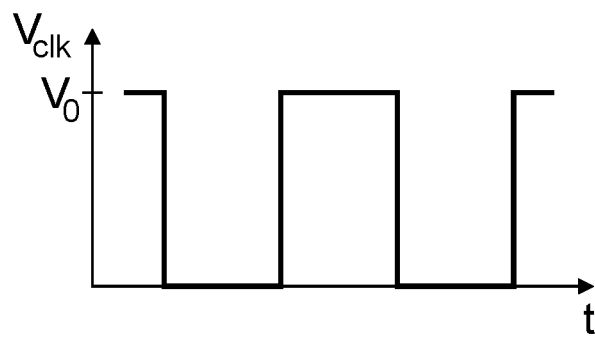

In addition, an inverting charge pump 9 and a clock signal generator 10 to activate the charge pump 9 are integrated in the semiconductor chip. The clock generator has a first power supply connection 11 and a second power supply connection 12. A first power supply connection 11 is connected to the first voltage supply connection 2 and the second power supply connection 12 is connected to the second voltage supply connection 3. If there is a supply voltage between the supply voltage connections 2, 3, the clock signal generator 10 outputs the rectangular clock signal shown in FIG. 2 at a clock signal output 13 with amplitude $V_0$.

The charge pump 9 has an input voltage connection 14, a first output voltage connection 15, and a second output voltage connection 16. The input voltage connection 14 is capacitively coupled via a capacitor element 17 with the clock signal output 13 of the clock signal generator 10. The first output connection 15 is connected to the gate and the second output connection 16 is connected to the bulk or well of the first insulated-gate field-effect transistor 7.

Figure 3:
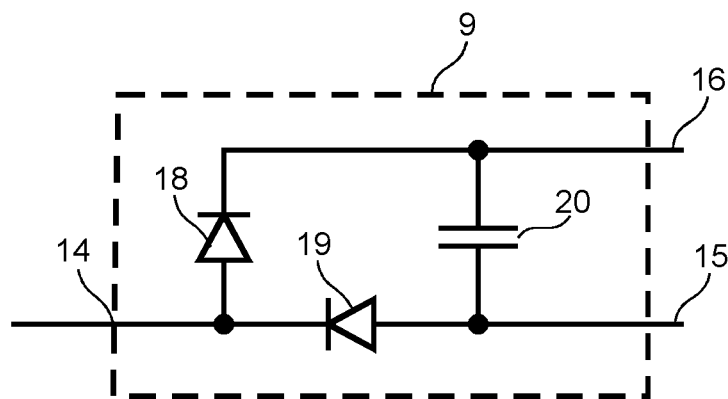

As can be seen in FIG. 3, the charge pump 9 has a first diode 18, a second diode 19, and a capacitor 20 connected parallel to its output connections 15, 16. The anode of the first diode 18 is connected to the input connection 14 of the charge pump 9 and the cathode of the first diode 18 is connected to a first electrode of the capacitor 20. The anode of the second diode 19 is connected to a second electrode of the capacitor 20 and the cathode of the second diode 19 is connected to the input connection 14 of the charge pump 9.

Figure 4:
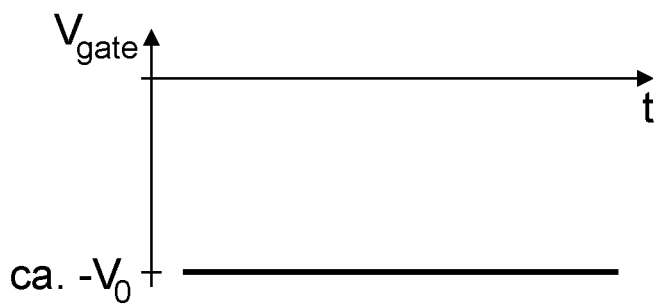

As can be seen in FIGS. 1 and 4, the charge pump converts the square wave signal of the clock signal generator 10 into a negative DC voltage that is applied between the gate and the bulk of the first insulated-gate field-effect transistor 7. This DC voltage has a sign that is opposite the sign of the clock signal voltage, and the amount of the DC voltage corresponds approximately to the amplitude of the clock signal applied at the clock signal generator 10 output.

The gate of the first insulated-gate field-effect transistor 7 is connected to the bulk of the first insulated-gate field-effect transistor 7 by means of a discharge path in which a resistor 21 is arranged. The DC voltage applied between the gate and bulk effects a current flow in the resistor 21. This is so slight however, that the capacitor 20 only slightly discharges within the pulse pauses of the clock signal generator 10 square wave signal. Consequently the source drain line of the first insulated-gate field-effect transistor 7 is conductive when the clock signal generator 10 generates the rectangular clock signal, i.e., when the supply voltage is applied between the supply voltage connections 2, 3.

If the supply voltage is missing, which can happen, for example, when a line break occurs in at least one of the supply lines 2, 3 or the supply voltage source connected to the supply lines 2, 3 drops out, no clock signal is output at the clock signal output 13. A possible electrical voltage on the capacitor 18 is balanced by means of the discharge path. Thereafter there is no voltage applied between the gate and bulk of the first insulated-gate field-effect transistor 7, resulting in its source-drain line becoming high resistance.

Both when applying an external voltage to the output connection and when applying a voltage to the output of the output stage, to ensure that the bulk of the first insulated-gate field-effect transistor is always at a potential that is higher than the potential on the output connection, the semiconductor chip has an extreme value selector 22 with a first selector input 23, a second selector input 24, and an extreme value output 25. The extreme value selector 22 is designed as a maximum selector that, when the electrical potentials on the selector inputs 23, 24 differ, connects the selector input 23, 24 with the highest potential to the selector output 25. The first selector input 23 is connected to the drain connection of the first insulated-gate field-effect transistor 7, the second selector input 24 is connected to the source connection of the first insulated-gate field-effect transistor 7, and the extreme value output 25 is connected to the bulk of the first insulated-gate field-effect transistor 7.

Figure 5:
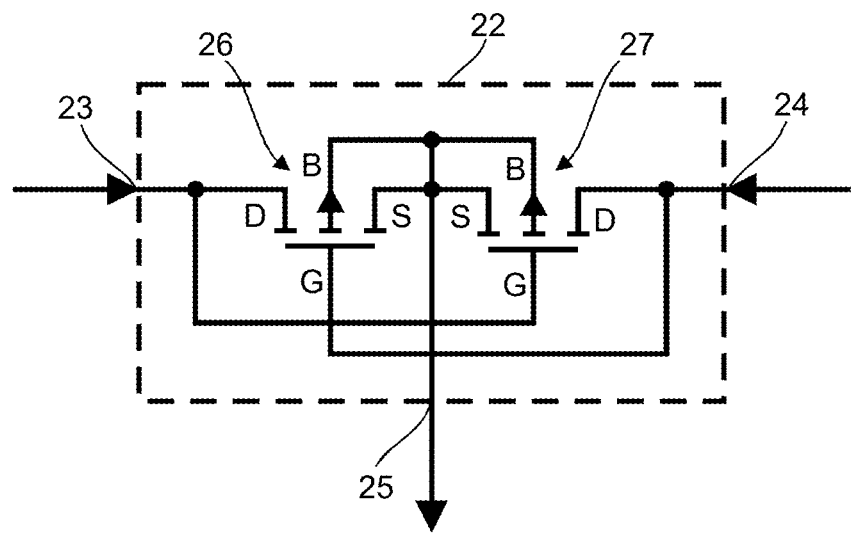

As can be seen in FIG. 5, the extreme value selector 22 has a second self-closing insulated-gate field-effect transistor 26 of P-channel type and a third self-closing insulated-gate field-effect transistor 27 of P-channel type. The first selector input 23 is connected to the drain connection of the second insulated-gate field-effect transistor 26 and the gate of the third insulated-gate field-effect transistor 27. The second selector input 24 is connected to the drain connection of the third insulated-gate field-effect transistor 27 and the gate of the second insulated-gate field-effect transistor 26. The extreme value output 25 is connected to the source connection and bulk connection of the second insulated-gate field-effect transistor 26 as well as the source connection and bulk connection of the third insulated-gate field-effect transistor 27.

In the exemplary embodiment of the invention shown in FIG. 6, the first insulated-gate field-effect transistor 7 is of N-channel type and the extreme value selector 22' is designed as a minimum selector. In addition, the gate voltage applied at the output connections has the opposite polarity as that in the exemplary embodiment in accordance with FIG. 1

Figure 7:
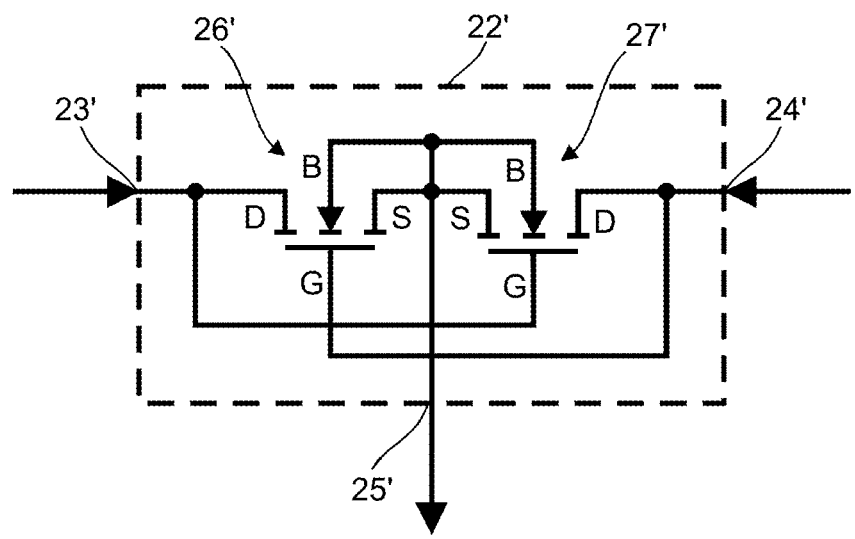
Figure 8:
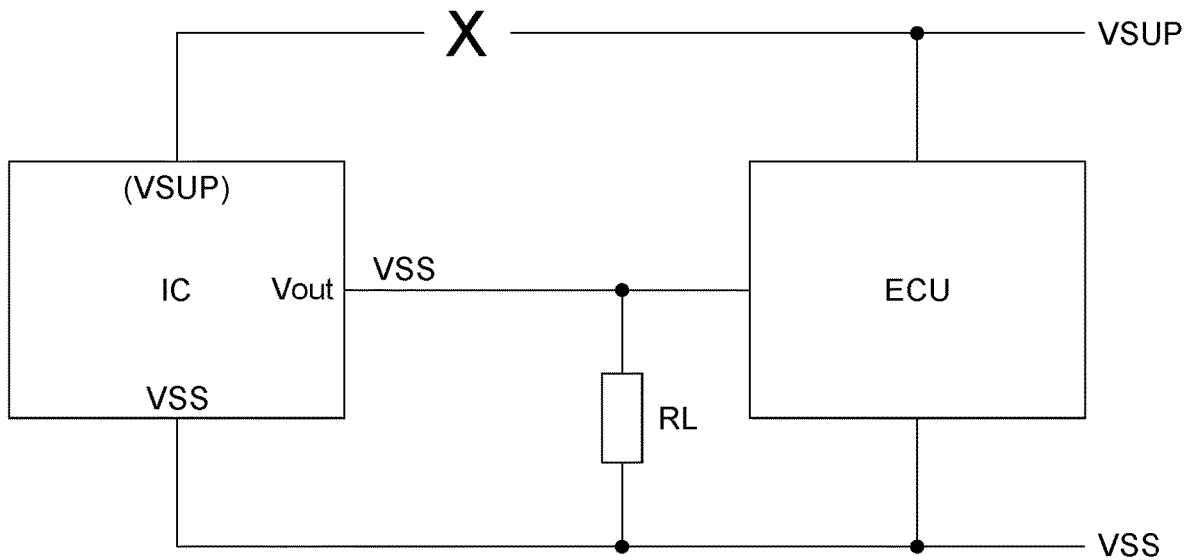
Figure 9:
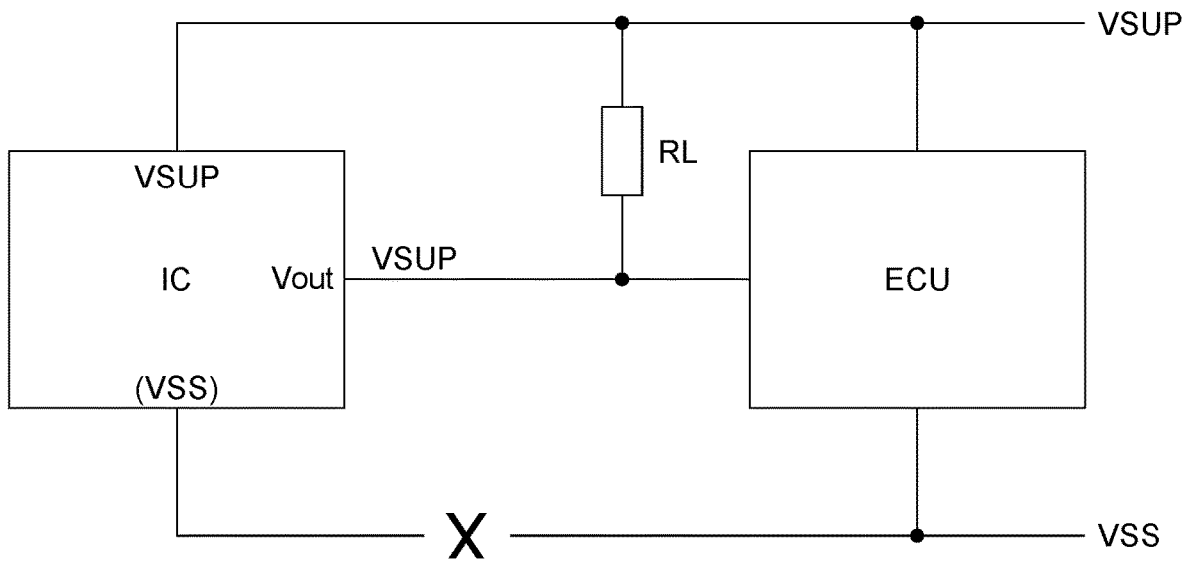
Figure 10:
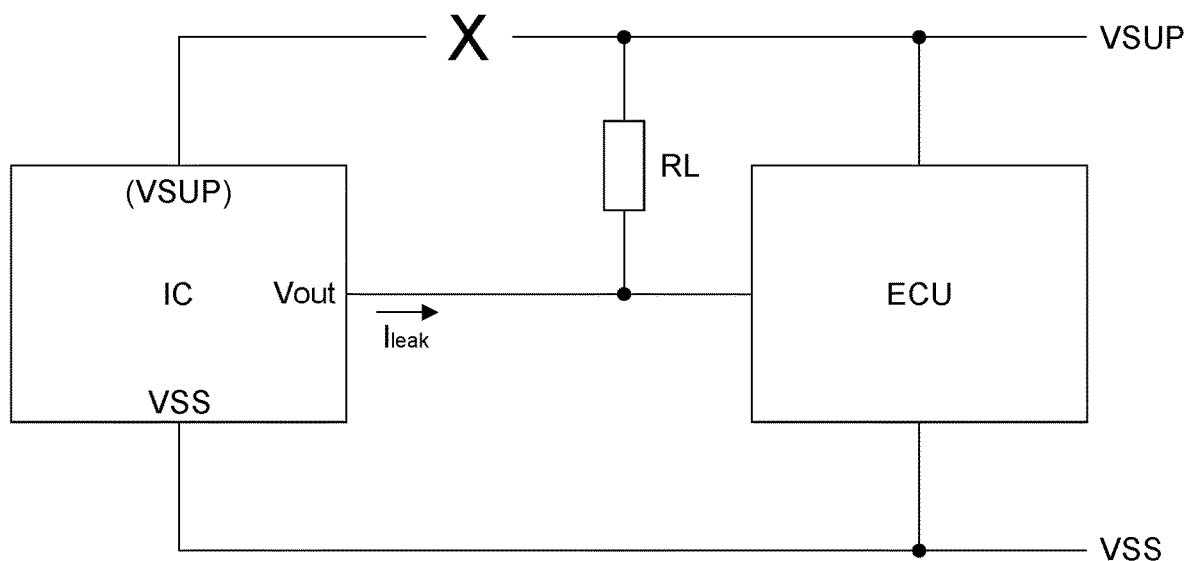
Figure 11:
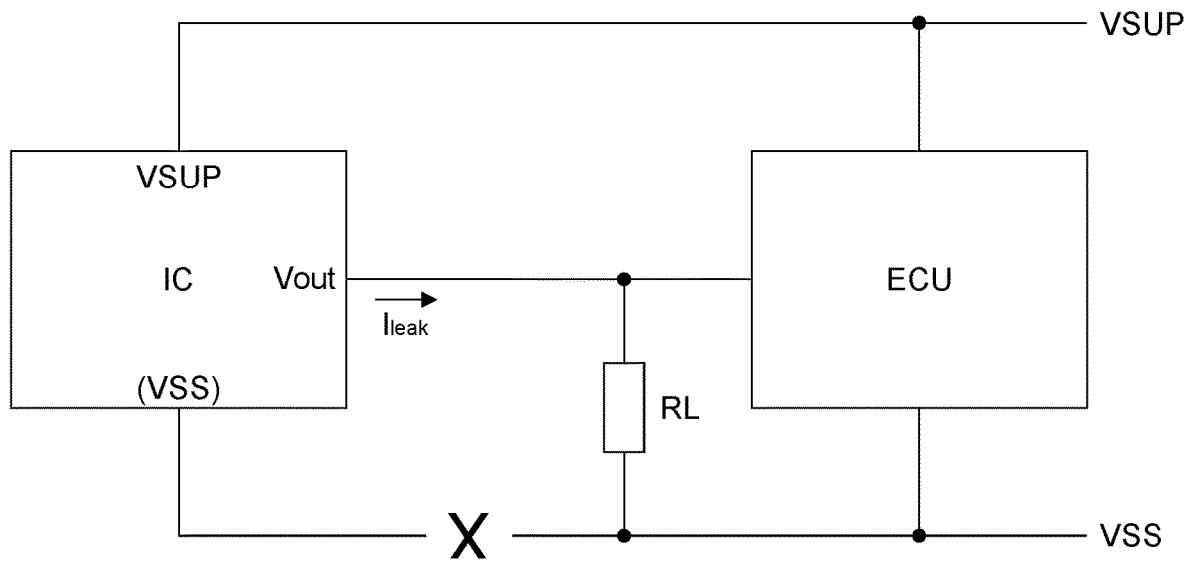

The extreme value selector 22' in FIG. 7 differs from the extreme value selector 22 in accordance with FIG. 5 in that the second and third insulated-gate field-effect transistors 26', 27' are of N-channel type. If the electric potentials on the selector inputs 23', 24' differ, the extreme value selector 22' connects the selector input 23', 24' showing the lowest potential to the extreme value output 25'. Furthermore, the exemplary embodiment shown in FIG. 6 corresponds to the exemplary embodiment in FIG. 1.

It should still be noted that the output stage of the integrated circuit 1 is designed as a CMOS output stage, which has a half bridge in which a first insulated-gate field-effect transistor element 28 and a complementary second insulated-gate field-effect transistor element 29 are connected in series. The source of the first insulated-gate field-effect transistor element 28 is connected to the first supply voltage connection 2 of the semiconductor chip and the source of the second insulated-gate field-effect transistor element 29 is connected to the second supply voltage connection 3 of the semiconductor chip. The output 4 of the output stage is arranged on a half-bridge section connecting the drain of the first insulated-gate field-effect transistor element 28 to the drain of the second insulated-gate field-effect transistor element 29. The gates of the insulated-gate field-effect transistor elements 28, 29 are connected to an output assigned to each from an activation device only shown as a schematic in FIGS. 1 and 6, and that is also supplied with current via the supply voltage connections.

The invention claimed is:

1. A semiconductor chip with an integrated circuit that has a first and a second supply voltage connection as well as an output stage with at least one output for the release of an output signal, wherein the output of the output stage is connected to an output connection for the output signal via a drain-source line of a first self-closing insulated-gate field-effect transistor, that the semiconductor chip has a clock signal generator fed by the supply voltage connections and a charge pump with an input voltage connection and output voltage connections to release an output voltage, that a clock signal output of the clock signal generator for creating a clocked input voltage that is connected by means of capacitive and/or inductive coupling with the input voltage connection of the charge pump, that to create a gate voltage on the first insulated-gate field-effect transistor a first output voltage connection of the charge pump is connected to the gate and a second output voltage connection of the charge pump is connected to the bulk of the first insulated-gate field-effect transistor, and that parallel to this a discharge path is connected to balance a voltage applied to the output voltage connections of the charge pump when there is a missing clock signal.

2. The semiconductor chip according to claim 1, wherein the semiconductor chip has an extreme value selector that is connected with a first selector input to the drain connection of the first insulated-gate field-effect transistor, with a second selector input connected to the source connection of the first insulated-gate field-effect transistor, and with an extreme value output connected to the bulk of the first insulated-gate field-effect transistor, whereby the first insulated-gate field-effect transistor is of N-channel type, and the extreme value selector is designed as a minimum selector that, when the electrical potentials on the selector inputs differ, connects the selector input with the lowest potential to the selector output.

3. The semiconductor chip according to claim 1, wherein the semiconductor chip has an extreme value selector that is connected with a first selector input to the drain connection of the first insulated-gate field-effect transistor, with a second selector input connected to the source connection of the first insulated-gate field-effect transistor, and with an extreme value output connected to the bulk of the first insulated-gate field-effect transistor, and that the first insulated-gate field-effect transistor is of P-channel type, and the extreme value selector is designed as a maximum selector that, when the electrical potentials on the selector inputs differ, connects the selector input with the highest potential to the selector output.

4. The semiconductor chip according to claim 1, wherein the charge pump has a capacitor connected parallel to its output connections as well as a first and a second diode, whereby an anode of the first diode is connected to an input connection of the charge pump and a cathode of the first diode is connected to a first electrode of the capacitor, and whereby an anode of the second diode is connected to a second electrode of the capacitor and a cathode of the second diode is connected to the input connection of the charge pump.

5. The semiconductor chip according to claim 1, for which the first insulated-gate field-effect transistor is of P-channel type, and the extreme value selector is designed as a maximum selector, wherein the maximum selector has a second self-closing insulated-gate field-effect transistor of P-channel type and a third self-closing insulated-gate field-effect transistor of P-channel type, that a first selector input is connected to the drain connection of the second insulated-gate field-effect transistor and a gate of the third insulated-gate field-effect transistor, that the second selector input is connected to a drain connection of the third insulated-gate field-effect transistor and a gate of the second insulated-gate field-effect transistor, and that an extreme value output of the maximum selector is connected to a source connection and a bulk connection of the second insulated-gate field-effect transistor as well as a source connection and a bulk connection of the third insulated-gate field-effect transistor.

6. The semiconductor chip according to claim 1, for which the first insulated-gate field-effect transistor is of N-channel type, and the extreme value selector is designed as a minimum selector, wherein the minimum selector has a second self-closing insulated-gate field-effect transistor of N-channel type and a third self-closing insulated-gate field-effect transistor of N-channel type, that a first selector input is connected to a drain connection of the second insulated-gate field-effect transistor and a gate of the third insulated-gate field-effect transistor, that a second selector input is connected to a drain connection of the third insulated-gate field-effect transistor and a gate of the second insulated-gate field-effect transistor, and that an extreme value output of the minimum selector is connected to a source connection and a balk connection of the second insulated-gate field-effect transistor as well as a source connection and a bulk connection of the third insulated-gate field-effect transistor.

7. The semiconductor chip according to claim 1, wherein the output stage is a CMOS output stage, in which a first insulated-gate field-effect transistor element is arranged with a complementary second insulated-gate field-effect transistor element, that a source of the first insulated-gate field-effect transistor element is connected to a first supply voltage connection and a source of the second insulated-gate field-effect transistor element is connected to a second supply voltage connection, and that an output of the output stage is provided on a half-bridge section connecting the drain of the first insulated-gate field-effect transistor element with the drain of the second insulated-gate field-effect transistor element.

* * * * *